United States Patent
Hsu et al.

(10) Patent No.: US 7,626,583 B2
(45) Date of Patent: Dec. 1, 2009

(54) VOLTAGE DETECTION SYSTEMS AND VOLTAGE DETECTION CIRCUITS THEREOF

(75) Inventors: Po-Tang Hsu, Taipei (TW); Meng-Chang Tsai, Taipei (TW)

(73) Assignee: Au Optronics Corp., Hsinchu (TW)

( * ) Notice: Subject to any disclaimer, the term of this patent is extended or adjusted under 35 U.S.C. 154(b) by 736 days.

(21) Appl. No.: 11/460,455

(22) Filed: Jul. 27, 2006

(65) Prior Publication Data

US 2007/0159181 A1 Jul. 12, 2007

(30) Foreign Application Priority Data

Jan. 12, 2006 (TW) .............................. 95101213 A

(51) Int. Cl.
*G01R 27/00* (2006.01)

(52) U.S. Cl. ....................................... 345/204; 324/600

(58) Field of Classification Search ................... 345/87, 345/93, 100, 204; 324/600, 306; 349/152, 349/200; 156/273.9
See application file for complete search history.

(56) References Cited

U.S. PATENT DOCUMENTS

| | | | | |
|---|---|---|---|---|
| 4,721,365 A | * | 1/1988 | Nishimura | 349/152 |
| 4,964,700 A | * | 10/1990 | Takabayashi | 349/200 |
| 5,019,201 A | * | 5/1991 | Yabu et al. | 156/273.9 |
| 6,114,852 A | * | 9/2000 | Zhou et al. | 324/306 |
| 6,812,908 B2 | * | 11/2004 | Lim | 345/87 |
| 7,119,783 B2 | * | 10/2006 | Lim | 345/100 |

\* cited by examiner

*Primary Examiner*—Amare Mengistu
*Assistant Examiner*—Yuk Chow
(74) *Attorney, Agent, or Firm*—Thomas, Kayden, Horstemeyer & Risley

(57) ABSTRACT

A voltage detection system comprising a first circuit board, a second circuit board, and a voltage detection circuit. The voltage detection circuit comprises a first connection unit, a second connection unit, a resistor, and a voltage detection unit. Dummy lines of the first and second connection units are coupled in series. When lines of the first and second connection units are not aligned to lines of the first and second circuit boards, an entirety equivalent impedance of the dummy lines is decreased. When detecting that the entirety of equivalent impedance is decreased to be less than a predetermined value, the voltage detection unit enables a control signal.

10 Claims, 3 Drawing Sheets

VOLTAGE DETECTION SYSTEMS AND VOLTAGE DETECTION CIRCUITS THEREOF

BACKGROUND OF THE INVENTION

1. Field of the Invention

The present invention relates to a detection circuit, and in particular relates to a voltage detection circuit.

2. Description of the Related Art

FIG. 1 shows a conventional connection between circuit boards. Referring to FIG. 1, connection boards 14 are coupled between circuit boards 12 and 16 and transmit signals therebetween. To connect the circuit boards 12 and 16 with the connection boards 14, conductive films, such as anisotropic conductive adhesives, are disposed between the circuit boards 12 and 16 and the connection boards 14, and the connection boards 14 are mounted on the circuit boards 12 and 16.

As the design of the circuit boards 12 and 16 becomes more complicated, more lines are disposed on each board, thus, the distance between the lines is reduced. When the distance between the lines approaches the error limit due to certain factors, such as alignment errors, the lines on connection board 14 can not be aligned to the lines on the circuit boards 12 and 16.

FIGS. 2a and 2b are cross-sectional views along line V-V in FIG. 1. As shown in FIG. 2a, when the lines 142 and 144 of the connection board 14 are respectively aligned to the lines 122 and 124 of the circuit board 12, the lines 142 and 144 can be respectively electrically connected to the lines 122 and 124 through anisotropic conductive adhesives 122. However, when alignment errors between the lines 122 and 144 and the lines 142 and 144 occurs, the line 144 of the connection 14 is electrically connected to the line 122 of the circuit board 12, resulting in mis-connection.

To avoid mis-connection, a conventional detection method is used to detect the impedance of the line 142 of the connection board 14. When the line 142 of the connection board 14 is totally electrically connected to the line 122 of the circuit board 12, the line 142 has a maximum impedance. When the line 142 of the connection board 14 is not electrically connected to the line 122 of the circuit board 12, the line 142 has a minimum impedance.

Whether the line 142 is electrically connected to the line 122 or not can be determined by detecting the impedance of the line 142. It is noted that although the line 142 has a maximum impedance, the impedance is smaller for the entire connection board 14 and is not easily detected.

BRIEF SUMMARY OF THE INVENTION

An exemplary embodiment of a voltage detection system comprises a first circuit board, a second circuit board, and a voltage detection circuit. The first circuit board has a first shorting line. The second circuit board has second and third shorting lines. The voltage detection circuit is coupled between the first and second circuit boards. An exemplary embodiment of a voltage detection circuit comprises a first connection unit, a second connection unit, a resistor, and a voltage detection unit.

The first connection unit comprises a first dummy line and a second dummy line. One terminal of the first dummy line is coupled to the first circuit board to receive a first voltage, and the other terminal of the first dummy line is coupled to one terminal of the second shorting line. One terminal of the second dummy line is coupled to one terminal of the first shorting line, and the other terminal of the second dummy line is coupled to the other terminal of the second shorting line.

The second connection unit comprises a third dummy line and a fourth dummy line. One terminal of the third dummy line is coupled to the other terminal of the first shorting line, and the other terminal of the third dummy line is coupled to one terminal of the third shorting line. The fourth dummy line has a first terminal and a second terminal. The first terminal is coupled to the first circuit board, and the second terminal is coupled to the other terminal of the third shorting line.

The resistor is coupled between the first and second voltages. The voltage detection unit detects a voltage of the first terminal and outputs a control signal. When the voltage of the first terminal is less than a predetermined value, the voltage detection unit enables the control signal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
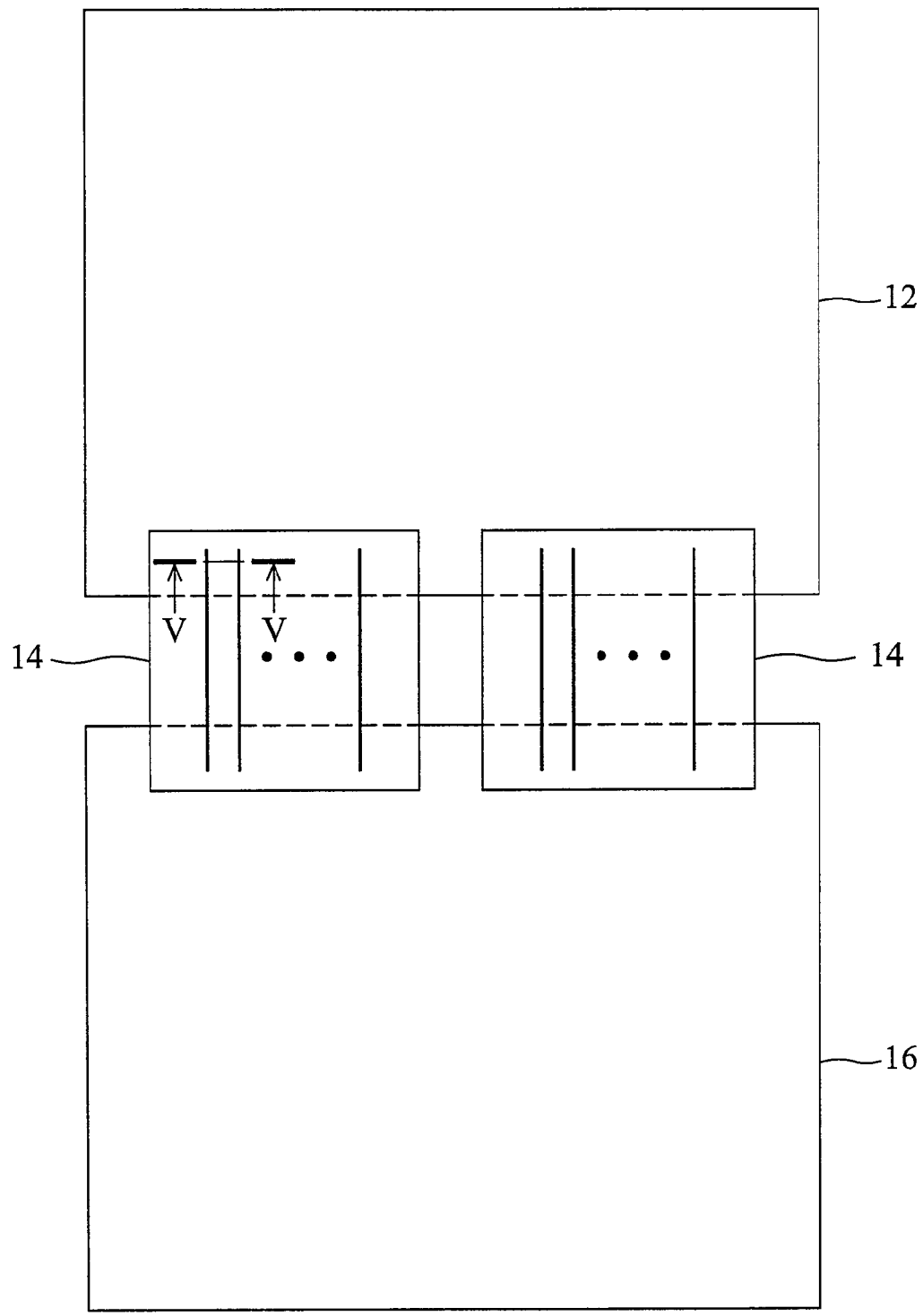
FIG. 1 shows the connection between circuit boards.
Figure 2A:
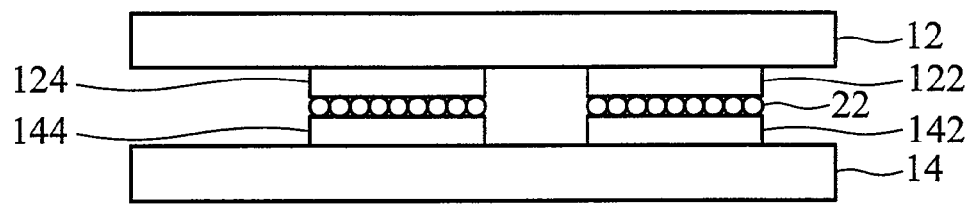
FIGS. 2a and 2b are cross-sectional views along line V-V in FIG. 1.
Figure 2B:
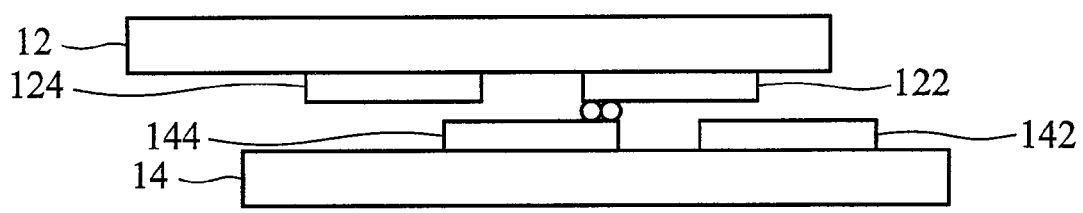
Figure 3:
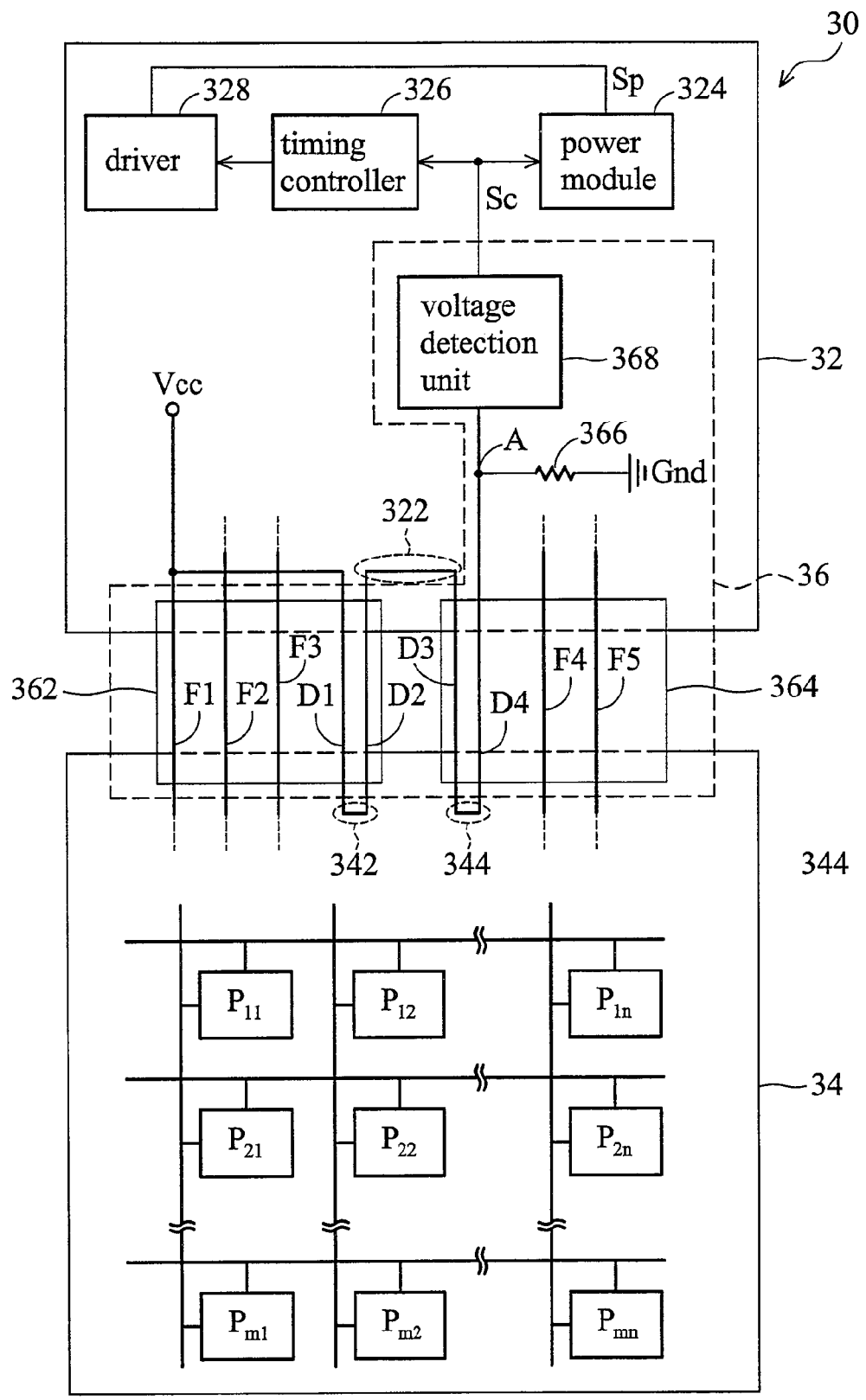
FIG. 3 depicts an embodiment of a voltage detection system.

Voltage detection systems are provided. In an exemplary embodiment of a voltage detection system in FIG. 3, a voltage detection circuit 30 comprises circuit boards 32 and 34 and a voltage detection circuit 36. The circuit board 32 comprises a shorting line 322, and the circuit board 34 comprises shorting lines 342 and 344. The voltage detection circuit 36 comprises connection units 362 and 364, a resistor 366, and a voltage detection unit 368. In this embodiment, the circuit board 34 is a glass substrate on which a plurality of pixels $P_{11}$ to $P_{mn}$ is disposed. The circuit board 32 is a control board for providing a control signal to the pixels $P_{11}$ to $P_{mn}$. The circuit board 32 comprises a power module 324, a timing controller (TCon) 326, a driver 328.

The power module 324 provides voltage to the pixels $P_{11}$ to $P_{mn}$ of the circuit board 34 or voltage Sp to the driver 328 for normal operation. The timing controller 326 provides a clock signal to the driver 328, thus, the driver 328 can provide driving signals to the circuit 34 according to the clock signal.

The connection unit 362 comprises dummy lines D1 and D2. One terminal of the dummy line D1 is coupled to the circuit board 32 for receiving a voltage Vcc, and the other terminal thereof is coupled to one terminal of the shorting line 342. In this embodiment, the voltage Vcc has a high voltage level. One terminal of the dummy line D2 is coupled to one terminal of the shorting line 322, and the other terminal thereof is coupled to the other terminal of the shorting line 342. The dummy lines D1 and D2 can not transmit signals and can be disposed on the edge of the connection unit 362.

The connection unit 362 further comprises function lines F1 to F3, each functioning to transmit signals. In this embodiment, the function lines F1 to F3 can transmit a voltage signal Vcc and the driving signals provided by the driver 328 to the circuit board 34.

The connection unit 364 comprises dummy lines D3 and D4. One terminal of the dummy line D13 is coupled to the other terminal of the shorting line 322, and the other terminal thereof is coupled to one terminal of the shorting line 344. The dummy line D4 has a first terminal and a second terminal. The first terminal is coupled to the circuit board 32, and the second terminal is coupled to the other terminal of the shorting line 344. The dummy lines D3 and D4 do not transmit signals and can be disposed on the edge of the connection unit 364.

The connection unit 362 further comprises function lines F4 and F5, each functioning to transmit signals. In this embodiment, the function lines F4 and F5 can transmit driving signals provided by the driver 328 to the circuit board 34.

The resistor 366 is coupled between the first terminal of the dummy line D4 and a voltage Gnd. In this embodiment, the resistor 366 is disposed on the circuit board 32, and the voltage Gnd has a low voltage level. The voltage detection unit 368 detects the voltage of the first terminal of the dummy line D4 and outputs a control signal Sc. In this embodiment, the voltage detection unit 368 is a comparator and disposed on the circuit board 32.

Each dummy line has an equivalent impedance. After the connection units 362 and 364 are mounted on the circuit boards 32 and 34, it can be known whether the function lines F1 to F5 of the connection units 362 and 364 are aligned to the lines of the circuit boards 32 and 34 or not by detecting a voltage of a node A.

When the function lines F1 to F5 are not aligned to the lines of the circuit boards 32 and 34, the dummy lines D1 to D4 are also not aligned to the lines of the circuit boards 32 and 34, so that the voltage of the node A is decreased. When the voltage of the node A is smaller than a predetermined value, the voltage detection unit 368 enables the control signal Sc. According to states of the control signal Sc, it can be determined whether the function lines F1 to F5 of the connection units 362 and 364 are aligned to the lines of the circuit boards 32 and 34.

When the control signal Sc is enabled, the power module 324 stops supplying the voltage Sp to the driver 328, thus, the driver 328 can no longer operate. Alternatively, the timing controller 326 stops providing the clock signal to the driver 328, so that the driver 326 stops providing the driving signals to the circuit board 34.

When the control signal Sc is disenabled, the power module 324 supplies the voltage Sp to the driver 328 for normal operation. Alternatively, the timing controller 326 provides the clock signal to the driver 328, thus, the driver 326 provides the driving signals to the circuit board 34.

If the number of dummy lines coupled in series increases, the entirety of the equivalent impedance become larger and can be detected more easily. When the lines of the connection units 362 and 364 are not aligned to the lines of the circuit boards 32 and 34, the control signal Sc is enabled, thus, the power module 324 stops supplying the voltage or the driver 328 stops providing the driving signals. Thus, it can be known whether the lines of the connection units 362 and 364 are not aligned to the lines of the circuit boards 32 and 34 or not by determining output signals of the power module 324 and driver 328, thus, the test program is simplified.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage detection circuit coupled between a first and second circuit boards, the first circuit board having a first shorting line, the second circuit board having second and third shorting lines, the voltage detection circuit comprising:
   a first connection unit comprising:
      a first dummy line, wherein one terminal of the first dummy line is coupled to the first circuit board to receive a first voltage, and the other terminal of the first dummy line is coupled to one terminal of the second shorting line; and
      a second dummy line, wherein one terminal of the second dummy line is coupled to one terminal of the first shorting line, and the other terminal of the second dummy line is coupled to the other terminal of the second shorting line;
   a second connection unit comprising:
      a third dummy line, wherein one terminal of the third dummy line is coupled to the other terminal of the first shorting line, and the other terminal of the third dummy line is coupled to one terminal of the third shorting line; and
      a fourth dummy line having a first terminal and a second terminal, wherein the first terminal is coupled to the first circuit board, and the second terminal is coupled to the other terminal of the third shorting line;
   a resistor having two terminals, wherein one terminal of the resistor is coupled to the first terminal, and the other terminal thereof receives a second voltage; and
   a voltage detection unit for detecting a voltage of the first terminal and outputting a control signal, wherein the voltage detection unit enables the control signal when the voltage of the first terminal is less than a predetermined value.

2. The voltage detection circuit as claimed in claim 1, wherein the first voltage has a high voltage level, and the second voltage has a low level.

3. The voltage detection circuit as claimed in claim 1, wherein the resistor is disposed on the first circuit board.

4. The voltage detection circuit as claimed in claim 3, wherein the voltage detection unit is disposed on the first circuit board.

5. The voltage detection circuit as claimed in claim 1, wherein the voltage detection unit includes a comparator.

6. The voltage detection circuit as claimed in claim 4, wherein the second circuit board is formed on a glass substrate on which a plurality of pixels are disposed.

7. The voltage detection circuit as claimed in claim 6, wherein the first circuit board includes a control board to control the pixels.

8. The voltage detection circuit as claimed in claim 7, wherein the control board comprises:
   a timing controller for outputting a clock signal and stopping outputting the clock signal when the control signal is enabled; and
   a driver for outputting a driving signal to the pixels in response to the clock signal.

9. The voltage detection circuit as claimed in claim 8, wherein the control board further comprises a power module for driving the driver and stopping driving the driver when the control signal is enabled.

10. The voltage detection circuit as claimed in claim 1, wherein the first and second dummy lines are adjacent to an edge of the first connection unit, and the third and fourth dummy lines are adjacent to an edge of the second connection unit.

* * * * *